United States Patent
Wada et al.

(10) Patent No.: US 7,442,912 B2
(45) Date of Patent: Oct. 28, 2008

(54) OPTICAL LOGIC DEVICE RESPONSIVE TO PULSED SIGNALS

(75) Inventors: Morio Wada, Tokyo (JP); Akira Miura, Tokyo (JP); Tsuyoshi Yakihara, Tokyo (JP); Masayuki Suehiro, Tokyo (JP); Daisuke Hayashi, Tokyo (JP); Shinji Iio, Tokyo (JP); Toshimasa Umezawa, Tokyo (JP); Takahiro Kudo, Tokyo (JP); Takashi Mogi, Tokyo (JP); Shoujirou Araki, Tokyo (JP); Machio Dobashi, Tokyo (JP); Katsuya Ikezawa, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/071,498

(22) Filed: Mar. 2, 2005

(65) Prior Publication Data

US 2005/0194519 A1    Sep. 8, 2005

(30) Foreign Application Priority Data

Mar. 4, 2004    (JP)    ............... P.2004-060212

(51) Int. Cl.
*H04J 4/00*    (2006.01)
*H04J 14/00*    (2006.01)

(52) U.S. Cl. ............... 250/214 R; 250/214 A; 398/47; 398/51

(58) Field of Classification Search ............ 250/214 R, 250/214 LA, 214 A, 214 LS; 327/514
See application file for complete search history.

(56) References Cited

U.S. PATENT DOCUMENTS

| | | | |
|---|---|---|---|
| 3,321,631 A | 5/1967 | Biard et al. | |
| 3,413,480 A | 11/1968 | Biard et al. | |
| 5,117,118 A * | 5/1992 | Fukuyama | 250/551 |
| 5,343,033 A * | 8/1994 | Cain | 250/208.2 |
| 6,762,676 B2 * | 7/2004 | Teowee et al. | 340/426.1 |
| 7,224,906 B2 * | 5/2007 | Cho et al. | 398/183 |
| 2002/0145776 A1 * | 10/2002 | Chow et al. | 359/124 |

FOREIGN PATENT DOCUMENTS

| | | |
|---|---|---|
| DE | 1 149 057 B | 5/1963 |
| DE | 1 447 223 A | 12/1968 |
| DE | 2 310 053 A | 9/1973 |
| DE | 690 23 082 T2 | 3/1991 |
| JP | 62-034432 A | 2/1987 |
| JP | 10050870 | 2/1998 |
| JP | 2004-061250 A | 2/2004 |

OTHER PUBLICATIONS

Heinz-Gunter Bach, (2003) "InP-Based High-Speed Photoreceivers for Optical Fibre Communications", Prag, Czech Republic, Invited Lecture Proceedings vol. 2, paper ThB3, pp. 123-134.
Japanese Office Action dated Jul. 17, 2008.

* cited by examiner

*Primary Examiner*—Thanh X Luu
*Assistant Examiner*—Tony Ko
(74) *Attorney, Agent, or Firm*—Sughrue Mion, PLLC

(57) ABSTRACT

An optical logic device performs a logic operation on a plurality of input light signals. The optical logic device has a photoelectric conversion portion, in which photoreceivers for receiving input light signals are provided in parallel, that outputs an electric signal obtained by adding up outputs of the photoreceivers, and a comparator that compares a voltage level of the electric signal outputted from the photoelectric conversion portion with a predetermined voltage level.

8 Claims, 8 Drawing Sheets

INPUT LIGHT SIGNAL S1

INPUT LIGHT SIGNAL S2

OUTPUT OF PHOTOELECTRIC CONVERSION PORTION 40

OUTPUT OF COMPARATOR 50 (OR-OPERATION)

OUTPUT OF COMPARATOR 50 (AND-OPERATION)

OPTICAL LOGIC DEVICE RESPONSIVE TO PULSED SIGNALS

CROSS-REFERENCE TO RELATED APPLICATIONS

This application is based upon and claims the benefit of priority from the prior Japanese Patent Applications No. 2004-060212, filed on Mar. 4, 2004, the entire contents of which are incorporated herein by reference.

BACKGROUND OF THE INVENTION

1. Field of the Invention

The present invention relates to an optical logic device which performs a logic operation on a plurality of input light signals, and particularly, to an optical logic device enabled to perform an optical operation on electric signals without performing time base adjustment on the electric signals after input light signals are converted into the electric signals.

2. Description of the Related Art

In optical communication systems, measuring apparatuses for optical communication, optical computers, and so on, logic operations, such as AND-operations, and OR-operations, are performed on multiple input light signals. Hitherto, a photoelectric conversion portion is provided corresponding to each of the input light signals. Then, these photoelectric conversion portions convert the input light signals into electric signals. The logic operations are formed on the converted electric signals (See, for example, the following document (1), that is, JP-A-10-50870.).

FIG. 6 is a diagram illustrating the configuration of a conventional circuit for performing logic operations. As illustrated in FIG. 6, a light signal delay portion 10a, to which an input light signal S1 is inputted, delays the input light signal S1 by a predetermined time and outputs the delayed signal S1. A photoelectric conversion portion 20a, to which the input light signal S1 outputted from the light signal delay portion 10a is inputted, outputs an electric signal, which has a voltage level corresponding to the light intensity of this input light signal S1.

A light signal delay portion 10b, to which an input light signal S2 is inputted, delays the input light signal S2 by a predetermined time, and outputs the delayed signal S2. A photoelectric conversion portion 20b, to which the input light signal S2 outputted from the light signal delay portion 10b is inputted, outputs an electric signal, which has a voltage level corresponding to the light intensity of this input light signal S2. Incidentally, a delay optical fiber and a quartz optical waveguide, which have desired lengths, are used as the light signal delay portions 10a and 10b.

A logic synthesis processing circuit 30 has an electric signal delay portion 31, and receives electric signals, which are inputted from the photoelectric conversion portion 20a and a photoelectric conversion portion 20b. Then, the logic synthesis processing circuit 30 performs logic operations (for example, AND-operations and OR-operations) and outputs results of the operations.

An operation of such a device is described hereinbelow.

The input light signals S1 and S2 are respectively inputted to the light signal delay portions 10a and 10b, respectively. Usually, the input light signals S1 and s2 are not simultaneously inputted to the light signal delay portions 10a and 10b, respectively, so that the deviation between the time bases of signals representing bits, on which a logic operation is performed, is caused. The causes of the deviation between the time bases are, for example, the difference in the distance or the material of transmission paths. The light signal delay portions 10a and 10b provide predetermined time delay amounts to the input light signals S1 and S2, respectively, to perform time base adjustment. Thus, the input light signals S1 and S2, which are timed, are outputted to the photoelectric conversion portions 20a and 20b.

Then, the photoelectric conversion portions 20a and 20b convert the input light signals S1 and S2 into electric signals and output the electric signals to the logic synthesis processing circuit 30. Subsequently, the electric signal delay portion 31 of the logic synthesis processing circuit 30 delays at least one of the converted electric signals by a predetermined time in such a way as to include a signal delay amount generated in an electric circuit in the logic synthesis processing circuit 30, so that the electric signals are timed. Further, logic operations are performed at an AND-circuit (not shown) and an OR-circuit (not shown) of the logic synthesis processing circuit 30, which then outputs results of the operations.

Next, the photoelectric conversion portions 20a and 20b are concretely described. FIG. 7 is a diagram illustrating an example of the configuration of each of the photoelectric conversion portions 20a and 20b. In this figure, components, which are the same as those shown in FIG. 6, are designates by the same reference characters as used for designating those in FIG. 6. Thus, the description thereof is omitted herein. As shown in FIG. 7, a resistor Rb is connected to a constant-voltage power supply Vcc at a terminal thereof. A capacitor Cb is connected to the other terminal of the resistor Rb at a terminal thereof, and also connected to the ground GND, which provides common electric potential, at the other terminal thereof. Further, the resistor Rb and the capacitor Cb constitute a bias circuit BC.

A photodiode PD is a photoreceiver and connected to the other terminal of the resistor Rb at a cathode thereof. Input light signals S1 and S2 are inputted to the photodiode PD (FIG. 7 illustrates an example in which the input light signal S1 is inputted thereto). A resistor RL is connected to an anode of the photodiode PD at a terminal thereof, and also connected to the ground GND at the other terminal thereof. An output terminal Vout is connected to the anode of the photodiode PD.

Incidentally, the resistor Rb of the bias circuit BC is a protective resistor for preventing the constant-voltage power supply from applying an overvoltage to the photodiode PD. Further, the capacitor Cb reduces noises originated from the constant-voltage power supply Vcc. Therefore, it is advisable to provide the bias circuit BC in the circuit, as need arises.

An operation of such a circuit is described hereinbelow.

When an input light signal S1 is inputted to the photodiode PD, the photodiode PD outputs a photocurrent corresponding to the light intensity thereof. Then, the photocurrent flows to the ground GND through the resistor RL. Thus, an electric signal having a voltage level corresponding to the light intensity of the input light signal S1 is outputted to the output terminal Vout.

Further, another example of each of the photoelectric conversion portions 20a and 20b is described hereinbelow. FIG. 8 is a diagram illustrating another example of the configuration of each of the photoelectric conversion portions 20a and 20b. Additionally, FIG. 8 shows what is called a balanced photoreceiver (See, for instance, the following document (2)). Incidentally, components, which are the same as those shown in FIG. 7, are designated by the same reference characters used for designating such components in FIG. 7. Thus, the description of such components is omitted herein.

As shown in FIG. 8, a bias voltage is applied to the photodiode by a bias-T BT1, which is connected to the constant-voltage power supply Vcc at a terminal thereof. The photodiode PD1 is connected to the other terminal of the bias-T BT1 at the cathode thereof. The photodiode PD2 is connected to the anode of the photodiode PD1 at a cathode thereof. That is, the photodiodes PD1 and PD2 are series-connected to each other. Incidentally, preferably, photodiodes having the same characteristics (for example, a dark current characteristic, a response speed characteristic, and a conversion efficiency characteristic) are used as the photodiodes PD1 and PD2. The bias-T BT2 is connected to the anode of the photodiode PD2 at a terminal thereof, and also connected to a constant-voltage Vee (Vcc>GND>Vee).

A capacitor C1 is connected to the other terminal of the bias-T BT1 at a terminal thereof and also connected to the ground GND at the other terminal thereof. Another capacitor C2 is connected to a terminal of the bias-T BT2 at a terminal thereof and also connected to the ground GND at the other terminal thereof. A resistor RL1 is connected to the other terminal of the capacitor C1 at a terminal thereof and also connected to the anode of the photodiode PD1 at the other terminal thereof. Another resistor RL2 is connected to the other terminal of the resistor RL1 at a terminal thereof and also connected to the other terminal of the capacitor C2 at the other terminal thereof. An output terminal Vout is connected to the other terminal of the resistor RL1. An optical coupler CP branches the input light signal S1 into two signals and outputs these two signals to the photodiodes PD1 and PD2, respectively.

An operation of such a circuit is described hereinbelow.

The input light signal S1 is branched by the optical coupler CP in two signals, which are inputted to the photodiodes PD1 and PD2, respectively. Incidentally, the optical coupler CP branches the input light signal S1 into two signals that have equal light intensity. Therefore, photocurrents outputted by the photodiodes PD1 and PD2 become differential signal photocurrents that are completely dependent of and reversed to each other. Furthermore, electric signals obtained by converting these photocurrents into voltages are outputted from the output terminal Vout.

The following documents are related to as referred to as related art.

(1) JP-A-10-50870 (Paragraph No. 0002).
(2) Heinz-Gunter Bach: "InP-Based High-Speed Photoreceivers for Optical Fiber Communications", 11th ECIO' 03 1.-4, USA, IEEE, Vol. 2, paper ThB3, pp. 123-134.

Thus, the photoelectric conversion portions 20a and 20b shown in FIGS. 7 and 8 convert the light signals, whose time bases are adjusted, into the electric signals, respectively. The logic synthesis processing circuit 30 performs logic operations on the electric signals converted separately from each other.

The transmission rate of the input light signals S1 and S2 in the optical waveguide or the optical fiber, in which the input light signals S1 and S2 are transmitted, is almost constant. Thus, the timing adjustment of the input light signals S1 and S2 can easily be performed by the light signal delay portions 10a and 10b. Further, change of the transmission rate can easily be achieved only by changing the length of the optical waveguide or the optical fiber.

However, the logic synthesis processing circuit 30 performs logic operations by using the electric signals respectively outputted from the plurality of photoelectric conversion circuits 20a and 20b. Thus, it is necessary to set an amount of delay, which is generated by the electric signal delay portion 31, by taking a delay amount of the electric signal, which is generated in the electric signal provided in the logic synthetic processing circuit 30, into account. Furthermore, because the amount of the generated delay varies with the kinds (AND-operation, OR-operation, and so forth) of the logic operations, there is need for setting the delay amounts generated by the electric signal delay portion 31, which are respectively associated with the kinds of the logic operations. Furthermore, even among devices of the same kind (for instance, transistors), there are differences in the delay amount. Thus, the setting of the delay amounts generated by the electric signal delay portion 31 is very difficult.

Furthermore, because the duration of each bit varies according to the transmission rate (expressed as, a bit rate), the delay amount introduced by the electric signal delay portion 31 should be set again when the transmission rate of the input light signals S1 and S2 are changed. However, it is very difficult to set again the delay amount. Thus, the logic operations are substantially performed on the basis of electric signal processing associated only with a fixed transmission rate.

Additionally, the electric signal delay portion 31 processing the electric signals can adjust the delay amount even in the case where the bit rate of the electric signal is 1 Gbps or so. However, in the case of a high bit rate (for example, 10 Gbps to 40 Gbps), it is very difficult for the electric signal delay portion 31 to perform the delay amount adjustment itself.

SUMMARY OF THE INVENTION

The object of the invention is to provide an optical logic device that enables to perform a logic operation without adjusting the time bases of electric signals after input light signals are converted into the electric signals.

The invention provides an optical logic device which performs a logic operation on the plurality of input light signals, having: a photoelectric conversion portion, in which photoreceivers for receiving the input light signals are provided in parallel, that outputs an electric signal obtained by adding up outputs of the photoreceivers, and a comparator that compares a voltage level of the electric signal outputted from the photoelectric conversion portion with a predetermined voltage level.

Furthermore, the photoreceiver is one of a photodiode, an avalanche photodiode, and a phototransistor.

Furthermore, the optical logic device has an amplification portion that is provided between the photoelectric conversion portion and the comparator, and that amplifies the electric signal outputted from the photoelectric conversion portion to output an amplified electric signal to the comparator.

Furthermore, the comparator outputs a result of performing an AND-operation or an OR-operation on the input light signals.

According to the optical logic device, the photoreceivers provided in parallel convert the input light signals into photocurrents. Then, the photoelectric conversion portion adds up the photocurrents and converts a result of the addition into the electric signal. Subsequently, the photoelectric conversion portion outputs the converted electric signal to the comparator. Furthermore, the comparator can perform different logic operations only by changing the voltage level of a reference signal for comparison. Consequently, after the input light signals are converted into the electric signal, logic operations can be performed without adjusting the time base of the electric signal, differently from the case where the input light signals are separately converted into electric signals, and where logic operations are performed.

Further, the amplification portion amplifies the electric signal outputted from the photoelectric conversion portion and then outputs the amplified electric signal to the comparator. Thus, logic operations can accurately be performed even when the light intensities of the input light signals are very low.

DETAILED DESCRIPTION OF THE PREFERRED EMBODIMENTS

Embodiments of the invention are described by referring to the accompanying drawings.

Figure 1:
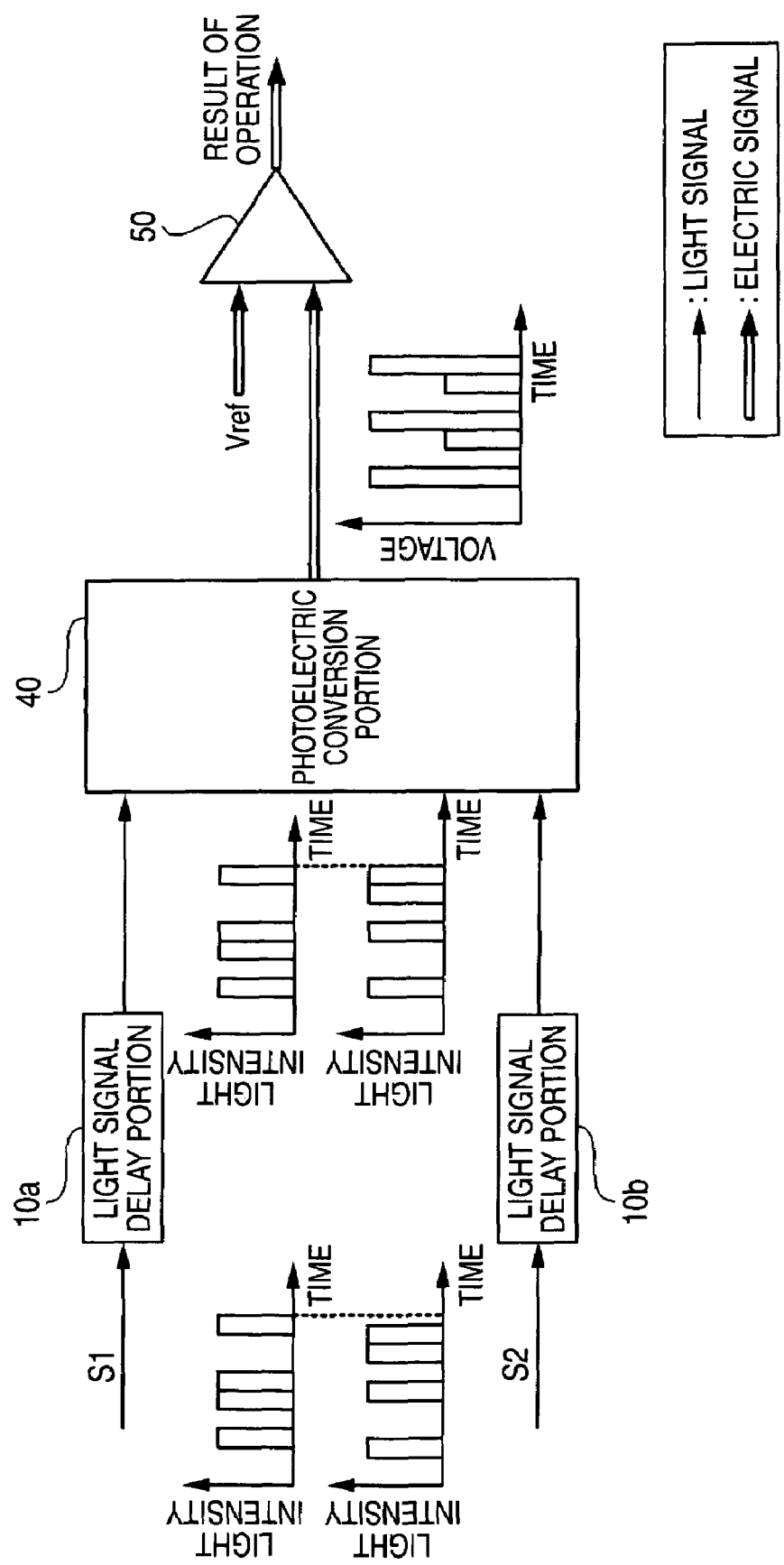
FIG. 1 is a diagram illustrating the configuration of a first embodiment of the invention.
Figure 2:
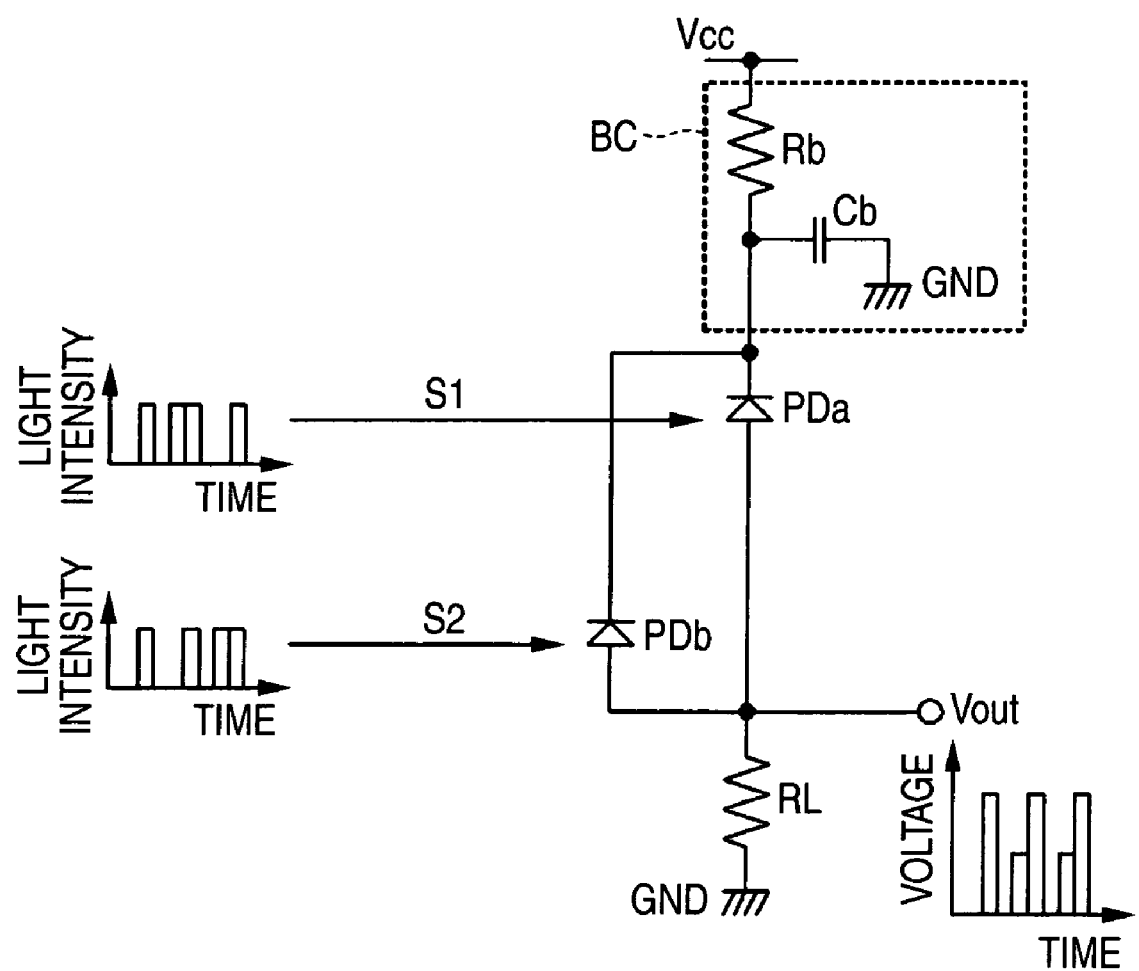
FIG. 2 is a diagram illustrating a configuration of a photoelectric conversion portion 40.
Figure 6:
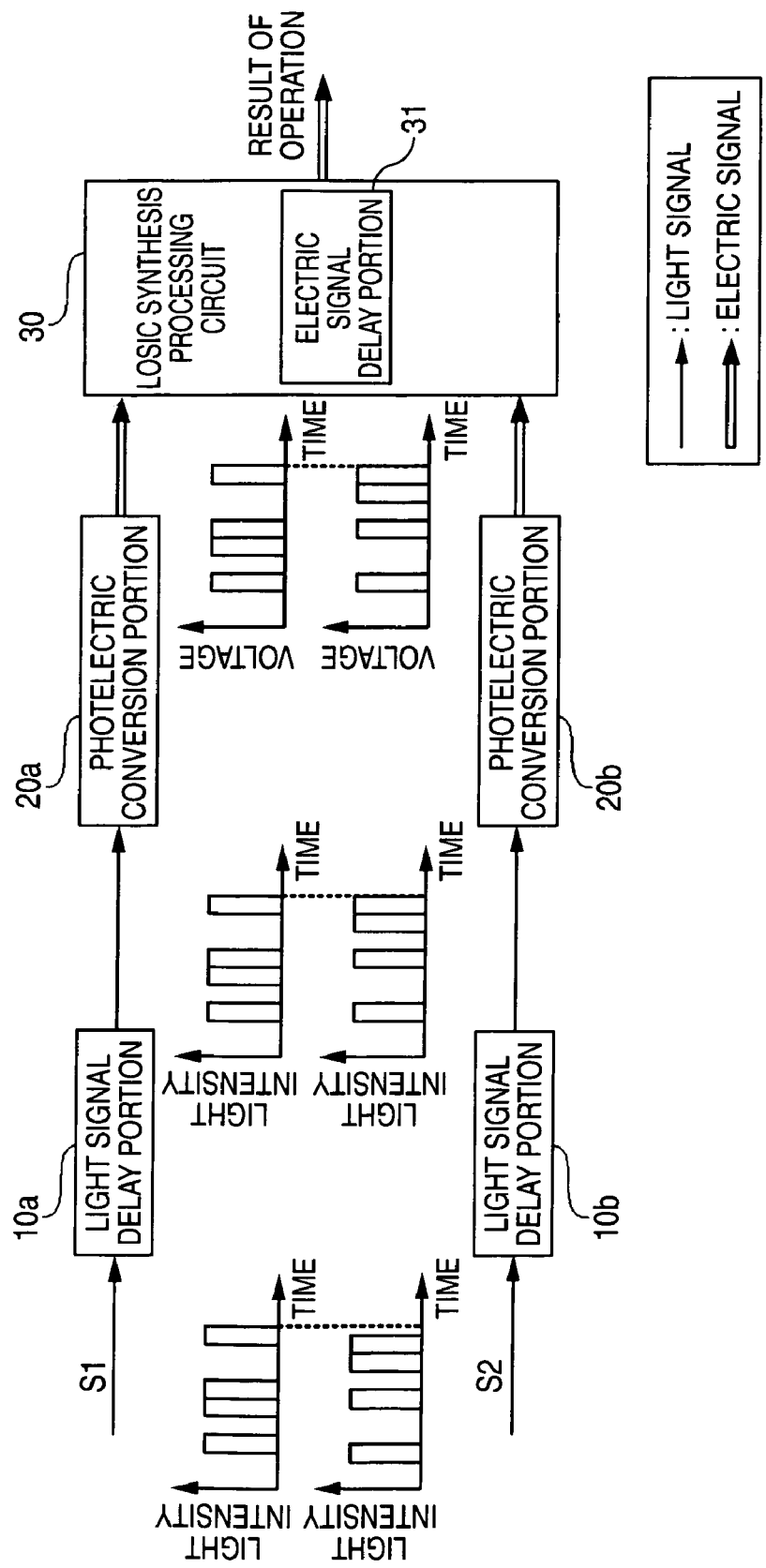
FIG. 6 is a diagram illustrating a configuration of a conventional optical logic device.

FIGS. 1 and 2 are diagrams illustrating an embodiment of the invention. Further, FIG. 2 is a diagram illustrating the configuration of a photoelectric conversion portion in an optical logic device shown in FIG. 1. Incidentally, constituents, which are the same those shown in FIG. 6, are designated by the same reference characters as those used for designating such constituents in FIG. 6. Thus, the description of such constituents is omitted herein. As shown in FIG. 1, a photoelectric conversion portion 40 is provided therein, instead of the photoelectric conversion portions 20a and 20b. Moreover, a comparator 50 is provided therein, instead of the logic synthesis processing circuit 30.

The photoelectric conversion portion 40 is provided with two photodiodes PDa and PDb, the number of which is equal to that of input light signals S1 and S2, in parallel with each other. The photoelectric conversion portion 40 outputs an electric signal, which represents a result of addition of outputs of the photodiodes PDa and PDb, to the comparator 50.

The comparator 50, to which the electric signal outputted from the photoelectric conversion portion 40 and a reference signal having a predetermined voltage level Vref are inputted, compares the electric signal with the reference signal and outputs an electric signal having a high level or a low level.

Figure 3A:
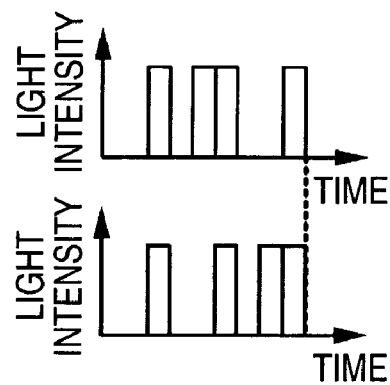
FIGS. 3A to 3E are graphs illustrating signals in the optical logic device shown in FIG. 1.
Figure 3B:
Figure 3C:
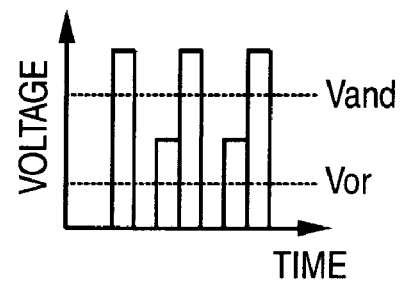
Figure 3D:
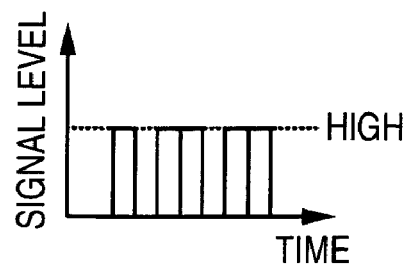
Figure 3E:
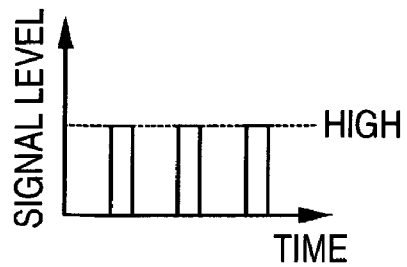
Figure 7:
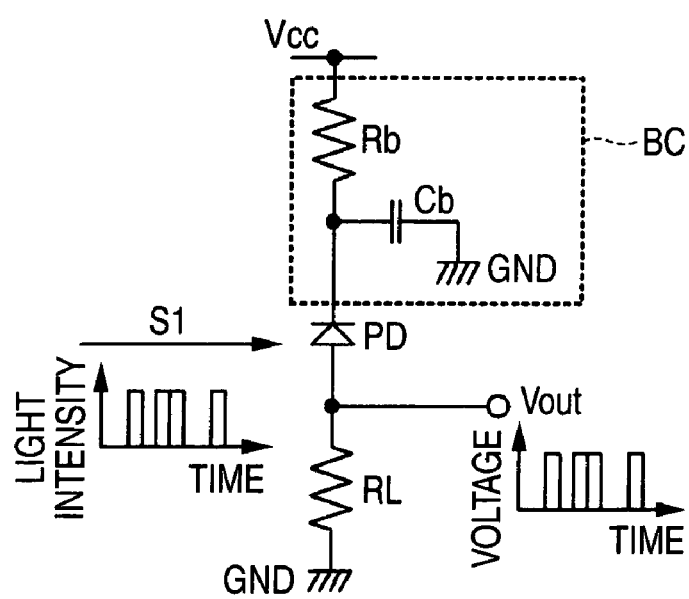
FIG. 7 is a diagram illustrating a configuration of each of photoelectric conversion portions 20a and 20b in a circuit shown in FIG. 6.

Next, the photoelectric conversion portion 40 is described in detail hereinbelow by referring to FIG. 2. Incidentally, constituents, which are the same those shown in FIG. 7, are designated by the same reference characters as those used for designating such constituents in FIG. 7. Thus, the description of such constituents is omitted herein. As shown in FIG. 2, photodiodes PDa and PDb are provided therein instead of the photodiode PD. The photodiodes PDa and PDb are photoreceivers, whose cathodes are connected to the other terminal of the bias circuit BC and whose anodes are connected to the output terminal Vout. Further, the input light signal S1 is inputted to the photodiode PDa, while the input light signal S2 is inputted to the photodiode PDb An operation of such a device is described hereinbelow. Further, FIGS. 3A to 3E are graphs illustrating signals in the device shown in FIG. 1. FIGS. 3A to 3E are described in order from top. FIG. 3A illustrates the input light signal S1 outputted by a light signal delay portion 10a. FIG. 3B illustrates the input light signal S2 outputted by a light signal delay portion 10b. FIG. 3C illustrates an electric signal outputted by the photoelectric conversion portion 40. FIG. 3D illustrates a signal representing a result of an operation, which is outputted by the comparator 50, after an OR-operation is performed. FIG. 3E illustrates a signal representing a result of an operation, which is outputted by the comparator 50, after an AND-operation is performed.

The input light signals S1 and S2, which have time-bases adjusted by the light signal delay portions 10a and 10b and represent bits synchronized with each other, are inputted to the photodiodes PDa and PDb, respectively (see FIGS. 3A and 3B). Then, when the input light signal S1 is inputted to the photodiode PDa, the photodiode PDa outputs a photocurrent corresponding to the light intensity thereof. Similarly, when the input light signal S2 is inputted to the photodiode PDb, the photodiode PDb outputs a photocurrent corresponding to the light intensity thereof.

Subsequently, photocurrents outputted from the photodiodes PDa and PDb flow through the resistor RL to the ground GND. Therefore, an electric signal obtained by adding up outputs of the photodiodes PDa and PDb is outputted from the output terminal Vout (see FIG. 3C). Needless to say, an electric signal having a voltage level obtained by adding up voltage levels, which respectively correspond to the light intensities of the input light signals S1 and S2, to each other.

That is, high-level light pulses, which represent bits, of the input light signals S1 and S2 are simultaneously inputted to the photodiodes PDa and PDb, respectively, an electric signal having a voltage level obtained by superimposing these input light signals is outputted from the photoelectric conversion portion 40. Further, in the case where a high-level signal is not inputted to one of the photodiodes, for instance, the photodiode PDa, and where a high-level signal is inputted only to the other photodiode PDb, only an output of the other photodiode PDb is outputted as the electric signal. Thus, the electric signal outputted from the photoelectric conversion portion 40 is a logic synthesis signal obtained by adding the input light signals S1 and S2 to each other.

Then, the electric signal obtained by converting the input light signals S1 and S2 is inputted to one of input terminals of the comparator 50 from the photoelectric conversion portion 40. Also, a reference signal for comparison is inputted to the other input terminal of the comparator 50 from a reference signal output portion (not shown).

Consequently, the comparator 50 compares the electric signal outputted from the photoelectric conversion portion 40 with the reference signal, and outputs a low-level or high-level digital signal. For instance, in the case where "the voltage level of the electric signal">"the voltage level of the reference signal", the comparator 50 outputs the high-level signal. Conversely, in the case where "the voltage level of the electric signal"<"the voltage level of the reference signal", the comparator 50 outputs the low-level signal.

For example, in the case of performing an OR-operation, when the voltage level Vref of the reference signal is set at Vor (see FIG. 3C), an output of the comparator 50 represents -a result of performing the OR-operation on the input light signals S1 and S2 (see FIG. 3D). Meanwhile, in the case of performing an AND-operation, when the voltage level Vref of the reference signal is set at Vand (see FIG. 3C), an output of the comparator 50 represents a result of performing the AND-operation on the input light signals S1 and S2 (see FIG. 3E).

Incidentally, let VLow designate a voltage level in the case of converting one of the light signals S1 and S2, which has light intensity being less than that of the other light signal. Let VHi denote a voltage level in the case of converting one of the light signals S1 and S2, which has light intensity being more than that of the other light signal. A voltage level in a case, in which both the light signals S1 and S2 have a low voltage level, is set to be 0. Preferably, the voltage levels Vor and Vand are set so that 0<Vor<VLow, and that VHi<Vand<(VLow+VHi).

Thus, the photodiodes PDa and PDb parallel-provided convert the input light signals S1 and S2 into photocurrents. Then, the photoelectric conversion portion 40 adds up the photocurrents and converts a result of the addition into an electric signal. Subsequently, the photoelectric conversion portion 40 outputs the electric signal to the comparator 50. Further, the comparator 50 can perform different logic operations only by changing the voltage level Vref of the reference signal for comparison. Consequently, after the input light signals are converted into the electric signal, logic operations can be performed without adjusting the time base of the electric signal, differently from a case where the input light signals S1 and S2 are separately converted into electric signals, and where logic operations are performed.

Additionally, photodiodes PDa and PDb having a response speed corresponding to a cutoff frequency of about 50 Gbps have been put into practical use. Further, because the time base adjustment of the converted electric signal is unnecessary, a logic operation can be performed on the input light signals S1 and S2 even when the input light signals S1 and S2 have very high bit rates (for example, 10 Gbps to 40 Gbps).

Also, because it is unnecessary to provide the electric signal delay portion 31 for delay the electric signal in the device, the circuit provided in a stage subsequent to the photoelectric conversion portion 40 can be simplified. Thus, the configuration of the entire optical logic device can be simplified.

Incidentally, the invention is not limited to this embodiment. The device according to the invention may have the following configurations.

(1) Although the foregoing description has described the configuration using the photodiodes PDa and PDb as examples of the photoreceivers, any photoreceiver may be used as long as the photoreceivers output electric signals corresponding to the light intensities of the input light signals S1 and S2. For instance, avalanche photodiodes and phototransistors may be used.

Figure 4:
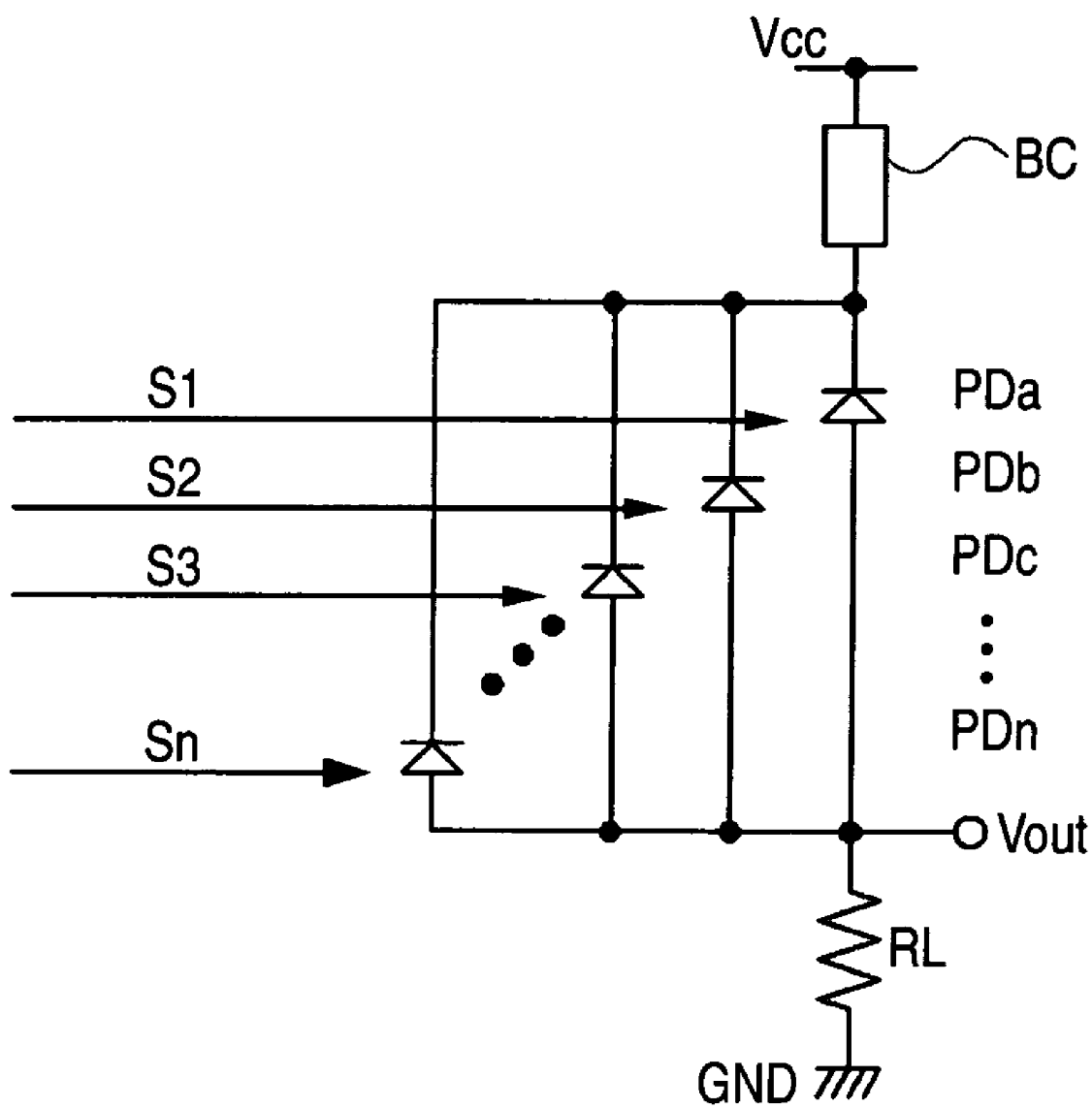
FIG. 4 is a diagram illustrating another configuration of the photoelectric conversion portion 40.

(2) Further, although the foregoing description has described the configuration for converting the two input light signals S1 and S2 into an electric signal, any number may be employed as the number of input light signals. Preferably, photodiodes PDa and PDb are provided for input light signals, respectively. For example, in the case where n of input light signals PDa to PDn are inputted, preferably, n of photodiodes PDa to PDn are parallel-provided in the device, as shown in FIG. 4. As shown in FIG. 4, the photodiodes PDa to PDn, to which the input light signals S1 to Sn are respectively inputted, output photocurrents. Each of the photodiodes PDa to PDn is connected to the other terminal of the resistor Rb of the bias circuit BC at the cathode thereof and also connected to the output terminal Vout at the anode thereof.

Further, let VLow' designate a voltage level in the case of converting one of high-level light signals S1 to Sn, which has light intensity being less than that of the other light signals. Let VHi' denote a voltage level in the case of converting one of the high-level light signals S1 to Sn, which has light intensity being more than that of the other light signals. Furthermore, let V1 to Vn designate voltage levels in the case of converting the high-level input light signals S1 to Sn into electric signals, respectively. A voltage level in a case, in which all the light signals S1 to Sn have a low voltage level, is set to be 0. Preferably, the voltage levels Vor and Vand are set so that 0<Vor<VLow', and that VHi'<Vand<"V1+V2+ . . . +Vn".

(3) Although the foregoing description has described the configuration provided with the light signal delay portions 10a and 10b, which respectively adjust the time bases of the input light signals S1 and S2, the light signal delay portions 10a and 10b may be omitted in the case where the time bases of input light signals S1 and S2 have already been adjusted.

(4) Although the foregoing description has described the configuration in which the electric signal outputted from the photoelectric conversion circuit 40 is inputted to the comparator 50, an amplification portion for amplifying the electric signal may be provided between the photoelectric conversion circuit 40 and the comparator 50. In the case where the bit rate is high, the light intensities of the input light signals S1 and S2 are very low. Therefore, when the input light signals S1 and S2 having low light intensities are converted into weak electric signals by the resistor RL having a very large resistance value, noises are generated. Alternatively, when the input light signals S1 and S2 having low light intensities are converted into weak electric signals, the comparison in the comparator 50 is very difficult to perform. Thus, preferably, the amplification portion amplifies the weak electric signal outputted from the photoelectric conversion circuit 40 and then outputs the amplified electric signal to the comparator 50. Needless to say, preferably, the voltage level of the reference signal is set by taking the gain of the amplification portion into account.

Thus, because the amplification portion amplifies the electric signal outputted from the photoelectric conversion portion 40 and outputs the amplified electric signal to the comparator 5, logic operations can accurately be performed even when the light intensities of the input light signals S1 and S2 are very low.

Figure 5:
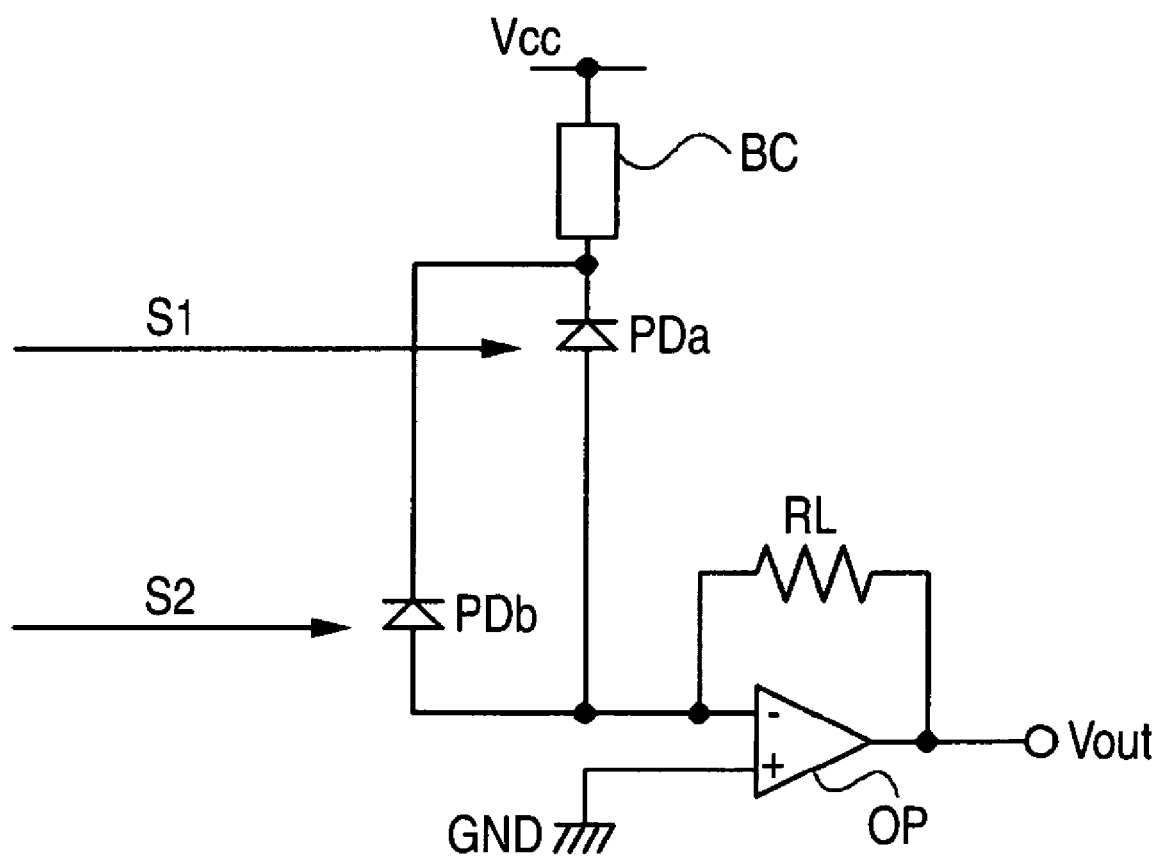
FIG. 5 is a diagram illustrating another configuration of the photoelectric conversion portion 40 using an operational amplifier.

(5) The foregoing description has described the device in which the photoelectric conversion portion 40 converts the photocurrents into voltages and outputs the converted voltages by using the resistor RL, any circuit may be employed, as long as the circuit can convert the photocurrents outputted from the photodiodes PDa and PDb into voltages. For example, FIG. 5 illustrates an example using an operational amplifier. In this figure, components, which are the same as those shown in FIG. 2, are designates by the same reference characters as used for designating those in FIG. 2. Thus, the description thereof is omitted herein. As shown in FIG. 5, an operational amplifier is newly provided therein so that a non-inverting input terminal thereof is connected to the ground GND, that an inverting input terminal thereof is connected to the anode of each of the photodiodes PDa and PDb, and that an output terminal thereof is connected to the output terminal Vout of the photoelectric conversion circuit 40. Moreover, the resistor RL is connected to the inverting input terminal and the output terminal of the operational amplifier. Thus, a negative feedback loop is constituted.

Such a circuit is nearly similar to the circuit shown in FIG. 2 and differs therefrom in operation, which is described hereinbelow.

Photocurrents outputted from the photodiodes PDa and PDb flow through the resistor RL. Consequently, an electric signal having a voltage level, which corresponds to a level obtained by adding up the photocurrent, is outputted from the output terminal Vout to the comparator 50. Incidentally, preferably, because the outputted electric signal is reversed, the electric signal is outputted to the comparator 50 through a NOT-circuit (not shown).

Figure 8:
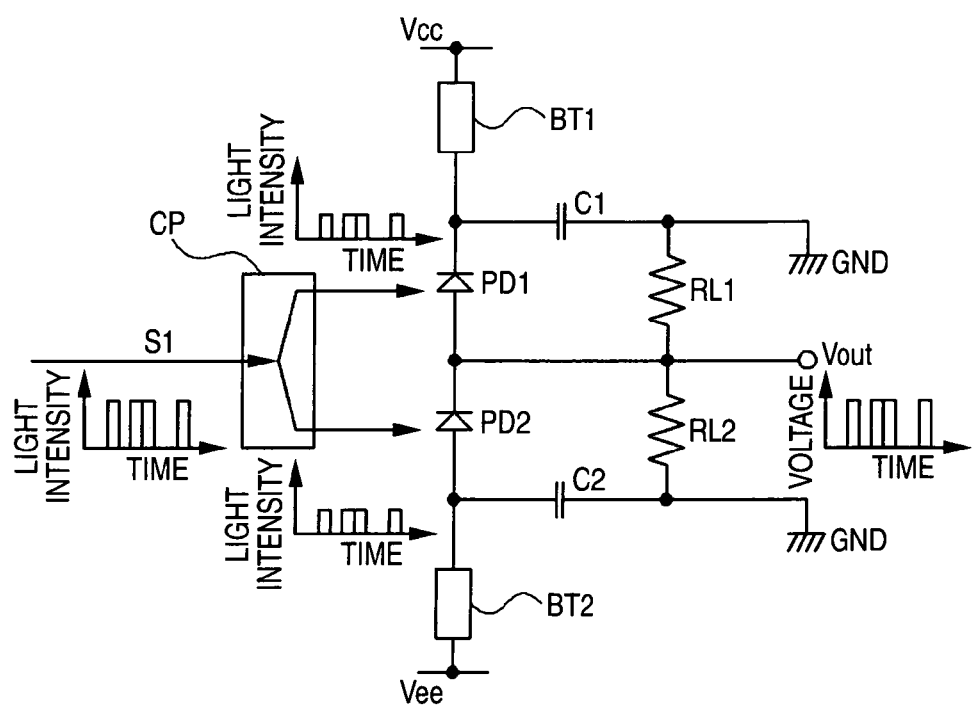
FIG. 8 is a diagram illustrating another configuration of each of the photoelectric conversion portions 20a and 20b in the circuit shown in FIG. 6.

(6) The foregoing description has described the device in which the bias circuit BC comprises the resistor Rb and the capacitor Cb, the device may have the bias-T shown in FIG. 8 instead of the bias circuit BC, as long as a bias voltage can be applied to each of the photodiodes PDa and PDb.

What is claimed is:

1. An optical logic device for use in an optical communication system, which performs a logic operation on a plurality of input pulsed light signals having bit rates of 10 Gbps or more, comprising:
    a photoelectric conversion portion, in which photoreceivers for receiving the input pulsed light signals at bit rates of 10 Gbps or more are provided in parallel, that outputs a pulsed electric signal obtained by directly adding up pulsed outputs of the photoreceivers; and
    a comparator that compares a voltage level of the pulsed electric signal outputted from the photoelectric conversion portion with a predetermined voltage level
    wherein said photoreceivers comprise an anode and a cathode, and the anodes of said plurality of photoreceivers are electrically coupled together and the cathodes of said plurality of photoreceivers are electrically coupled together, whereby there is direct addition of the pulsed outputs of said photoreceivers.

2. The optical logic device according to claim 1,
    wherein the photoreceiver is one of a photodiode, an avalanche photodiode, and a phototransistor.

3. The optical logic device according to claim 1, further comprising:
    an amplification portion that is provided between the photoelectric conversion portion and the comparator, and that amplifies the electric signal outputted from the photoelectric conversion portion to output an amplified electric signal to the comparator.

4. The optical logic device according to claim 1,
    wherein the comparator outputs a result of performing an AND-operation or an OR-operation on the pulsed electrical signal representing the input light signals.

5. An optical logic device which performs a logic operation on a plurality of input light signals representing information in bit form and having bit rates of 10 Gbps or more, comprising:
    a photoelectric conversion portion comprising a plurality of photoreceivers, said plurality of photoreceivers being operative to simultaneously receive separate input light signals having bit rates of 10 Gbps or more and to produce a plurality of separate photocurrents; said plurality of photocurrents being added up directly to produce a combined electric output signal, and
    a comparator operative to periodically compare a voltage level of the combined electric output signal with a predetermined voltage level,
    wherein said photoreceivers comprise an anode and a cathode, and the anodes of said plurality of photoreceivers are electrically coupled together and the cathodes of said plurality of photoreceivers are electrically coupled together, whereby there is direct addition of the pulsed outputs of said photoreceivers.

6. The optical logic device according to claim 5, further comprising:
    circuitry for performing an AND-operation or an OR-operation on the combined electric output signal representing the input light signals.

7. The optical logic device according to claim 6 wherein said AND and OR operation is based upon a determination of whether the input signal as converted to a voltage is above or below a reference level.

8. The optical logic device according to claim 5, further comprising delay portions for respectively adjusting the time bases of the input light signals.

* * * * *